US006795349B2

(12) United States Patent
Cernea

(10) Patent No.: US 6,795,349 B2
(45) Date of Patent: Sep. 21, 2004

(54) METHOD AND SYSTEM FOR EFFICIENTLY READING AND PROGRAMMING OF DUAL CELL MEMORY ELEMENTS

(75) Inventor: Raul A. Cernea, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/087,108

(22) Filed: Feb. 28, 2002

(65) Prior Publication Data

US 2003/0161185 A1 Aug. 28, 2003

(51) Int. Cl.[7] .............................................. G11C 16/04
(52) U.S. Cl. ........................... 365/185.33; 365/185.28; 365/185.05; 365/189.04
(58) Field of Search ....................... 365/185.28, 185.14, 365/185.11, 185.12, 51, 63, 185.33, 189.04, 189.01

(56) References Cited

U.S. PATENT DOCUMENTS

| | | | |
|---|---|---|---|
| 5,095,344 A | 3/1992 | Harari | 257/328 |
| 5,258,949 A | 11/1993 | Chang et al. | 365/185.19 |
| 5,278,439 A | 1/1994 | Ma et al. | |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,412,600 A | 5/1995 | Nakajima | |
| 5,576,992 A | 11/1996 | Mehrad | 365/185.24 |
| 5,579,259 A | 11/1996 | Samachisa et al. | 365/185.14 |
| 5,587,949 A | 12/1996 | Bergemont et al. | 365/185.03 |
| 5,661,053 A | 8/1997 | Yuan | 438/257 |
| 5,703,808 A | 12/1997 | Makwana et al. | 365/185.27 |
| 5,712,180 A | 1/1998 | Guterman et al. | 438/263 |
| 5,963,465 A | 10/1999 | Eitan | 365/63 |
| 6,002,152 A * | 12/1999 | Guterman et al. | 257/316 |
| 6,091,633 A | 7/2000 | Cernea et al. | 365/185.13 |
| 6,103,573 A | 8/2000 | Harari et al. | 438/257 |
| 6,151,248 A | 11/2000 | Harari et al. | 365/185.14 |
| 6,222,762 B1 | 4/2001 | Guterman et al. | 365/185.03 |
| 6,522,585 B2 * | 2/2003 | Pasternak | 365/185.21 |
| 6,532,172 B2 * | 3/2003 | Harari et al. | 365/185.14 |

* cited by examiner

Primary Examiner—Gene Auduong
(74) Attorney, Agent, or Firm—Beyer Weaver & Thomas, LLP

(57) ABSTRACT

A memory system (erg., memory card) for reading and programming (writing) of dual cell memory elements is disclosed. According to one aspect of the invention, all bit lines for the memory system can be productively used during reading or programming so as to achieve improved (e.g., maximum) parallelism of read and/or program operations. The memory system is typically a non-volatile memory product or device that provides binary or multi-state data storage.

33 Claims, 9 Drawing Sheets

METHOD AND SYSTEM FOR EFFICIENTLY READING AND PROGRAMMING OF DUAL CELL MEMORY ELEMENTS

CROSS REFERENCE TO RELATED APPLICATIONS

This application is related to U.S. Pat. Nos. 6,151,248 and 6,091,633, each of which is hereby incorporated by reference herein.

BACKGROUND OF THE INVENTION

1. Field of the Invention

The invention relates to a memory system for non-volatile data storage and, more particularly, to a memory system that provides reading and programming with high density.

2. Description of the Related Art

Memory cards are commonly used to store digital data for use with various products (e.g., electronic products). Typically, these memory cards are non-volatile memories which are very popular and useful because they retain data even after being powered-off. Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

These memory cards are increasingly called on to store greater and greater amounts of data. Consequently, individual storage elements within these memory cards have been developed to support multiple levels so as to effectively store multiple bits of data. Traditional storage elements store only two states, while multiple level or high density storage elements store more than two states (e.g., four states).

Besides increasing storage capacities of memory cards, there is also a continuing need to provide higher and higher performance operation. Namely, there is a need to improve the speed by which data can be read from or written to a memory card. Since the reading or programming of memory cells within memory is able to be performed with some degree of parallelism, the improved performance can come through increased parallelism. However, increased parallelism is not merely a matter of increasing hardware components, instead precise cells control and management of inter bit line interference must be considered. However, to obtain increased parallelism requires consideration of many complex characteristics of the memory cards, such as precise cell control and inter bit line interference.

Thus, there is a need for improved approaches to reading or writing data to a memory array with a greater degree of parallelism.

SUMMARY OF THE INVENTION

The invention relates to a memory system (e.g., memory card) in which density for reading and programming (writing) of dual cell memory elements is enhanced. According to one aspect of the invention, all bit lines for the memory system can be productively used during reading or programming so as to achieve improved (e.g., maximum) parallelism of read and/or program operations. The memory system is typically a non-volatile memory product or device that provides binary or multi-state data storage.

The invention can be implemented in numerous ways. For example, the invention can be implemented as a system, device or method. Several embodiments of the invention are discussed below.

As a non-volatile semiconductor memory device, one embodiment of the invention includes at least: a plurality of bit lines; a plurality of word lines; and a plurality of dual cell storage elements. Each of the dual cell storage elements includes at least a source device, a drain device and a select device. Advantageously, two out of a total of six of the source devices and the drain devices in three adjacent dual cell memory units along a particular one of the word lines are able to be programmed or read simultaneously.

As a portable memory card, one embodiment of the invention includes at least a data storage array and a controller. The data storage array includes at least a plurality of bit lines, a plurality of word lines, and a plurality of dual cell storage elements. Each of the dual cell storage elements includes at least a source device, a drain device and a select device. The controller operates to control reading and writing to the data storage array. Two of the source devices and the drain devices in three adjacent dual cell storage elements along a particular one of the word lines are able to be programmed or read simultaneously.

As a method for reading data from a non-volatile memory, one embodiment of the invention includes at least: identifying three adjacent memory elements along a particular word line, each of the three adjacent memory elements being coupled between an adjacent pair of bit lines, each of the three adjacent memory elements including at least a pair of memory cells; coupling one of the bit lines in each of the adjacent pairs of the bit lines surrounding each of two of the three adjacent memory elements having a memory cell to be read to a low potential; coupling a read voltage to the memory cell to be read in each of two of the three adjacent memory elements having a memory cell to be read; coupling an overdrive voltage to the other memory cells in the three adjacent memory cells; and thereafter simultaneously reading data from one of the two memory cells in the two of the three adjacent memory elements having a memory cell to be read via another of the bit lines in each of the adjacent pairs of the bit lines surrounding each of two of the three adjacent memory elements having a memory cell to be read.

As another method for reading data from a non-volatile memory, one embodiment of the invention includes at least: providing a non-volatile memory having an array of memory elements, a plurality of bit lines, a plurality of word lines, and a plurality of gate control signals; identifying first, second and third memory elements that are adjacent one another along a particular word line, each of the first, second and third memory elements including at least a pair of memory cells and a select gate; identifying first, second, third and fourth bit lines that are adjacent one another along the particular word line, the first memory element being interposed between the first bit line and the second bit line, the second memory element being interposed between the second bit line and the third bit line, and the third memory element being interposed between the third bit line and the fourth bit line; identifying a first memory cell in the first memory element and a second memory element in the third memory element to be read; coupling the first bit line and the fourth bit line to a low potential; coupling the other memory cells in the first, second and third memory elements other than the first and second memory cells to a high potential; coupling the particular word line to the select gates for the each of the first, second and third memory elements; coupling a read voltage to the first and second memory cells to be read; and thereafter simultaneously reading data from one of the first and second memory cells via the second and third bit lines.

As a method for programming data to a non-volatile memory, one embodiment of the invention includes at least: identifying three adjacent memory elements along a particular word line, each of the three adjacent memory elements being coupled between an adjacent pair of bit lines, each of the three adjacent memory elements including at least a pair of memory cells; coupling one of the bit lines in each of the adjacent pairs of the bit lines surrounding each of two of the three adjacent memory elements having a memory cell to be programmed to a program level potential; coupling the other of the bit lines in each of the adjacent pairs of the bit lines surrounding each of two of the three adjacent memory elements having a memory cell to be programmed to a low potential; coupling a program gate voltage to the memory cell to be programmed in each of two of the three adjacent memory elements having a memory cell to be read; coupling an overdrive voltage to the other memory cells in the three adjacent memory cells; and thereafter simultaneously programming data to one of the two memory cells in the two of the three adjacent memory elements having a memory cell to be programmed.

As another method for programming data to a non-volatile memory, one embodiment of the invention includes at least: providing a non-volatile memory having an array of memory elements, a plurality of bit lines, a plurality of word lines, and a plurality of gate control signals; identifying first, second and third memory elements that are adjacent one another along a particular word line, each of the first, second and third memory elements including at least a pair of memory cells and a select gate; identifying first, second, third and fourth bit lines that are adjacent one another along the particular word line, the first memory element being interposed between the first bit line and the second bit line, the second memory element being interposed between the second bit line and the third bit line, and the third memory element being interposed between the third bit line and the fourth bit line; identifying a first memory cell in the first memory element and a second memory element in the third memory element to be programmed; coupling the first bit line and the fourth bit line to a program level potential; coupling the other memory cells in the first, second and third memory elements other than the first and second memory cells to a high potential; coupling the particular word line to the select gates for the each of the first, second and third memory elements; coupling a program voltage to the first and second memory cells to be programmed; and thereafter simultaneously programming data to the first and second memory cells.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to a memory system (e.g., memory card) in which density for reading and programming (writing) of dual cell memory elements is enhanced. According to one aspect of the invention, all bit lines for the memory system can be productively used during reading or programming so as to achieve improved (e.g., maximum) parallelism of read and/or program operations. The memory system is typically a non-volatile memory product or device that provides binary or multi-state data storage.

Embodiments of this aspect of the invention are discussed below with reference to FIGS. 1 through 6. However, those skilled in the art will readily appreciate that the detailed description given herein with respect to these figures is for explanatory purposes as the invention extends beyond these limited embodiments.

Figure 1:
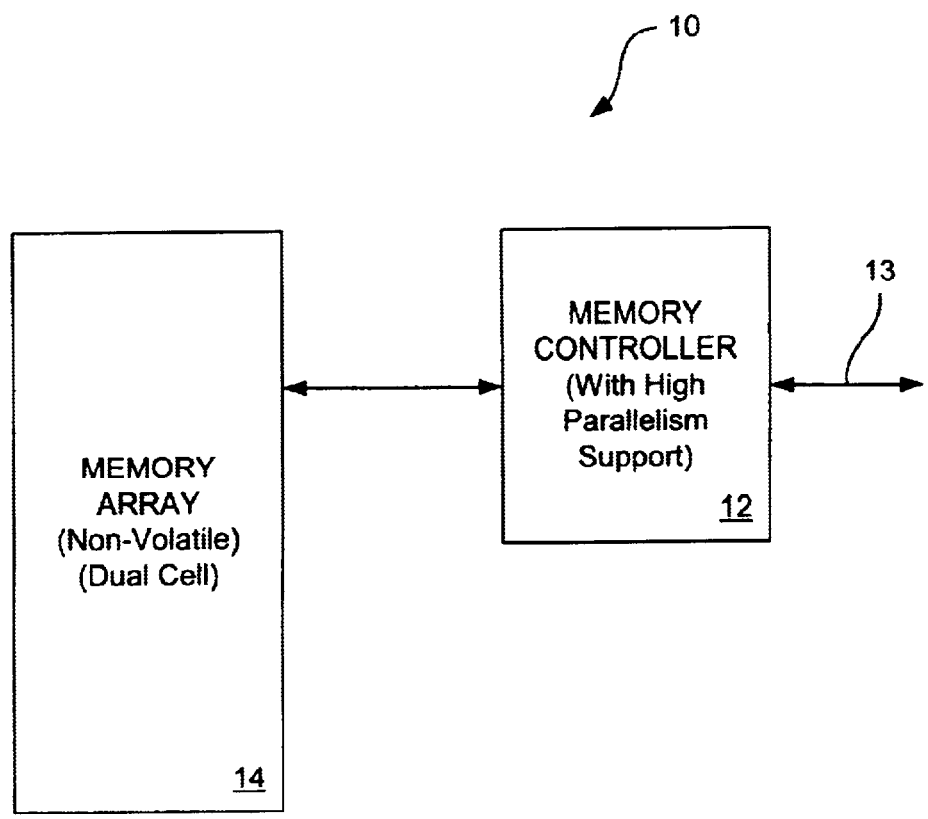
FIG. 1 is a functional block diagram of a memory system according to one embodiment of the invention.

FIG. 1 is a functional block diagram of a memory system 10 according to one embodiment of the invention. The memory system 10 includes a memory controller 12 that controls operations (e.g., read, erase, program) for the memory system 10 and communicates with a host over a data bus 13. The memory system 10 also includes memory array 14 that provides non-volatile data storage. According to the invention, read and program operations with respect to the memory array are able to be performed with maximized parallelism by actively using all bit lines during reading or programming. The memory controller 12 is able to efficiently read or program the memory array 14 with a high degree of parallelism.

The memory array 14 includes binary or multi-state data storage elements that provide the data storage. The multi-state data storage elements provide higher density storage for data because each such data storage element is capable of storing more than two states. In other words, each multi-state data storage element is capable of storing more than one bit of data, whereas each binary data storage element is capable of storing only a single bit of data. The data storage elements are typically arranged in blocks, which can represent the smallest write unit in one embodiment. Further, each data storage element is a dual cell memory element, meaning that each data storage element includes two memory cells.

With the improved parallelism provided by the invention, the unit of reading or programming pertains to three adjacent data storage elements. In other words, the unit of reading or programming density is three adjacent memory elements. Since each data storage element is a dual cell device, there are six memory cells within the three adjacent memory elements. Two of the six memory cells within the three adjacent memory elements can be concurrently read or programmed. Hence, with three passes or phases, all data can be read from or programmed to each of the memory cells provided in three adjacent dual cell data storage elements. Since every three adjacent data storage elements in the memory array 14 or in a block thereof can be read in this manner, all data can be read from or programmed to the memory array 14 or a block thereof with three passes or phases.

Sense amplifiers are typically provided with the memory array to read out data from the memory elements. To read data with the improved parallelism, one (1) sense amplifier would be provided for the equivalent of one and a half (1½) bit lines in a virtual ground array architecture.

The memory system 10 can, for example, be associated with a memory card (such as a plug-in card), a memory stick, or some other semiconductor memory product. Examples of memory cards include PC Card (formerly PCMCIA device), Flash Card, Flash Disk, Multimedia Card, and ATA Card.

Figure 2:
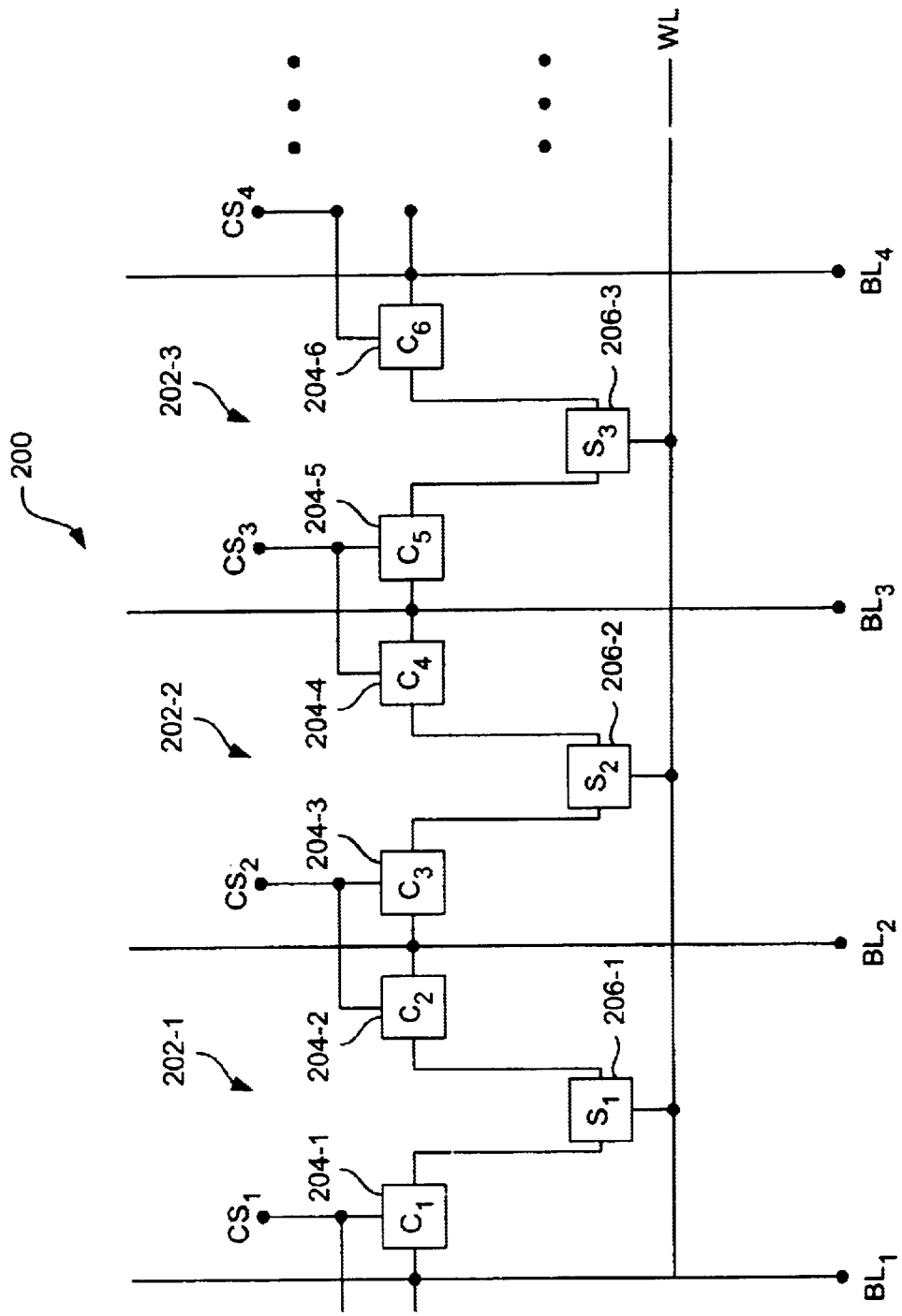
FIG. 2 is a schematic diagram of a memory block according to one embodiment of the invention.

FIG. 2 is a schematic diagram of a memory block 200 according to one embodiment of the invention. The memory block 200 illustrated in FIG. 2 pertains to a small portion of a memory array (e.g., memory array 14 of FIG. 1) utilized to store data for a data storage device.

The memory block 200 includes a plurality of dual cell memory elements 202. The portion of the memory block 200 shown in FIG. 2 illustrates three adjacent dual cell memory elements 202. Each of the dual cell memory elements 202 includes a pair of memory cells (C) 204 and a select gate (S) 206. More particularly, the dual cell memory element 202-1 includes a memory cell ($C_1$) 204-1, a memory cell ($C_2$) 204-2, and a select gate ($S_1$) 206-1. The dual cell memory element 202-2 includes a memory cell ($C_3$) 204-3, a memory cell ($C_4$) 204-4, and a select gate ($S_2$) 206-2. The dual cell memory element 202-3 includes a memory cell ($C_5$) 204-5, a memory cell ($C_6$) 204-6, and a select gate ($S_3$) 206-3.

The memory block 200 permits data to be programmed to or read from the memory cells (C) through use of electrical signals supplied to the memory cells (C) by way of bit lines (BL), word lines (WL), and control signals (CS). These electrical signals operate to bias the memory cells (C) to program, read or isolate select memory cells (C). In addition, although not further discussed, typically, the electrical signals can also erase previously programmed data from memory cells (C) in an individual, group or bulk manner. Normally, the electrical signals are applied by a memory controller (e.g., memory controller 12).

According to the arrangement of the memory block 200 shown in FIG. 2, four (4) adjacent bit lines ($BL_1$-$BL_4$) and a single word line (WL) are illustrated. The word line (WL) couples to a control terminal of the select gates 206-1, 206-2 and 206-3. The dual cell memory element 202-1 is provided between and coupled to the bit lines $BL_1$ and $BL_2$. The dual cell memory element 202-2 is provided between and coupled to the bit lines $BL_2$ and $BL_3$. The dual cell memory element 202-3 is provided between and coupled to the bit lines $BL_3$ and $BL_4$.

The operation of the memory block 200 is such that within three adjacent dual cell memory elements, such as the dual cell memory elements 202-1, 202-2 and 202-3 shown in FIG. 2, a read operation can simultaneously read two of the memory cells (C) within the three adjacent dual cell memory elements 202. Hence, to read or program the six memory cells across the three dual cell memory elements requires three passes. However, conventionally, memory elements of this nature were not able to be read or programmed with such efficiency and density. Hence, the ability to read or program requires only three passes according to the invention, whereas conventionally four or more passes were required. Thus, the invention roughly provides at least a 33% performance improvement with respect to reading and writing efficiency.

Figure 3:
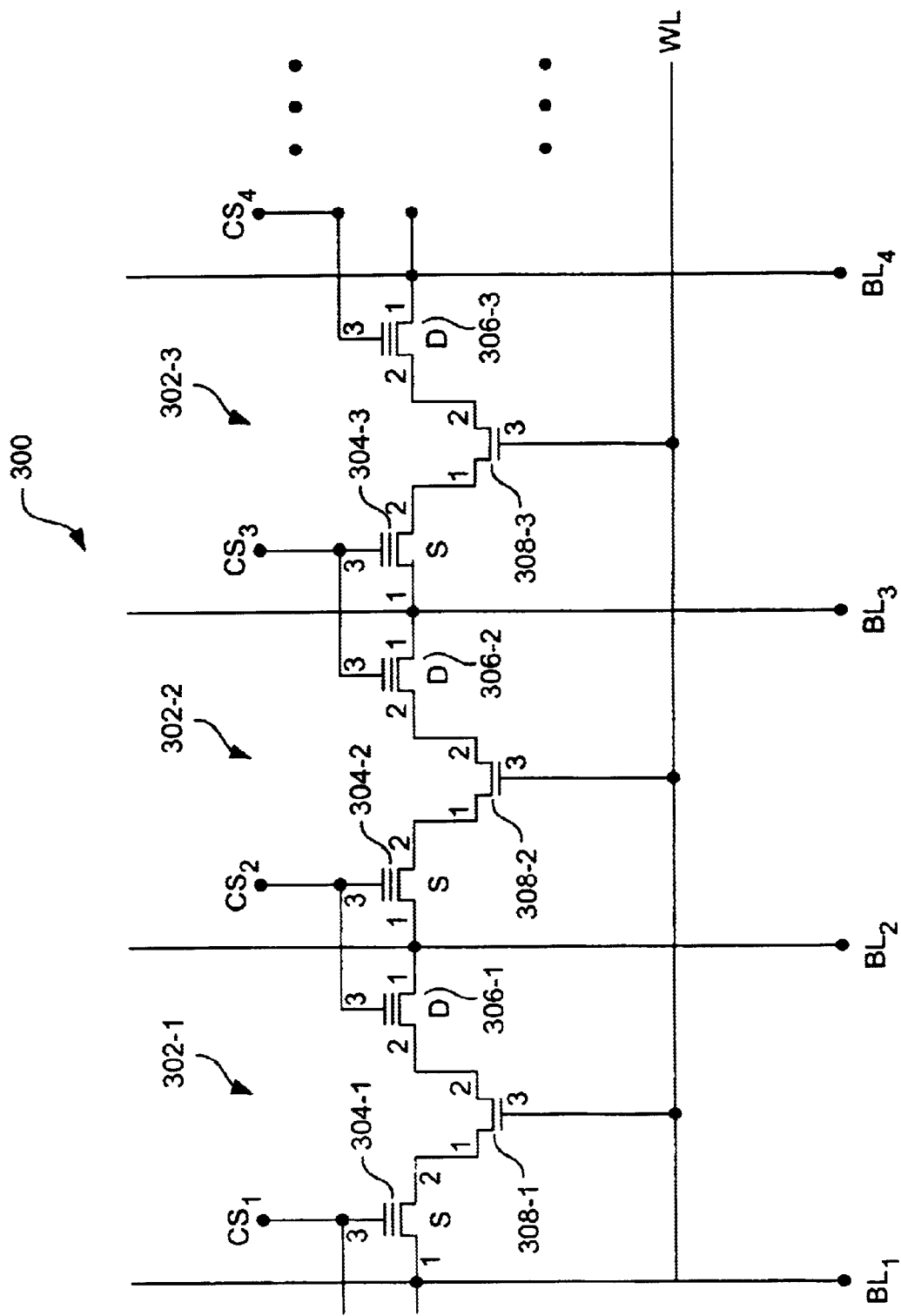
FIG. 3 is a detailed schematic diagram of a memory block according to one embodiment of the invention.

FIG. 3 is a detailed schematic diagram of a memory block 300 according to one embodiment of the invention. The memory block 300, for example, represents a detailed design for the memory block 200 illustrated in FIG. 2.

The memory block 300 includes dual cell memory elements 302 to implement the dual cell memory elements 202 illustrated in FIG. 2. The dual cell memory elements 302 couple to a particular word line (WL) and between adjacent bit lines (BL). The dual cell memory elements 302 can be referred to as dual floating gate cells. Each of the dual cell memory elements 302 includes a first floating gate cell 304, a second floating gate cell 306, and a select gate 308. Each of the first floating gate cells 304, the second floating gate cells 306 and the select gates 308 include first, second and third terminals. Typically, the first and second terminals pertain to first and second channel terminals (e.g., drain and source terminals) and the third terminal pertains to a control terminal (e.g., gate terminal).

The interconnections for the dual cell memory element 302-1 are as follows. The first terminal of the floating gate cell 304-1 is coupled to the bit line $BL_1$, the second terminal of the floating gate cell 304-1 is connected to a first terminal of the select gate 308-1, and the third terminal of the floating gate cell 304-1 is connected to a control signal $CS_1$. The first terminal of the floating gate cell 306-1 is coupled to the bit line $BL_2$, the second terminal of the floating gate cell 306-1 is connected to the second terminal of the select gate 308-1, and the third terminal of the floating gate cell 306-1 is connected to a control signal $CS_2$. The third terminal of the select gate 308-1 is coupled to the particular word line (WL).

The interconnections for the dual cell memory element 302-2 are as follows. The first terminal of the floating gate cell 304-2 is coupled to the bit line $BL_2$, the second terminal of the floating gate cell 304-2 is connected to a first terminal of the select gate 308-2, and the third terminal of the floating gate cell 304-2 is connected to the control signal $CS_2$. The first terminal of the floating gate cell 306-2 is coupled to the bit line $BL_3$, the second terminal of the floating gate cell 306-2 is connected to the second terminal of the select gate 308-2, and the third terminal of the floating gate cell 306-2 is connected to a control signal $CS_3$. The third terminal of the select gate 308-2 is coupled to the particular word line (WL).

The interconnections for the dual cell memory element 302-3 are as follows. The first terminal of the floating gate cell 304-3 is coupled to the bit line $BL_3$, the second terminal of the floating gate cell 304-3 is connected to a first terminal of the select gate 308-3, and the third terminal of the floating gate cell 304-3 is connected to the control signal $CS_3$. The first terminal of the floating gate cell 306-3 is coupled to the bit line $BL_4$, the second terminal of the floating gate cell 306-3 is connected to the second terminal of the select gate 308-3, and the third terminal of the floating gate cell 306-3 is connected to a control signal $CS_4$. The third terminal of the select gate 308-3 is coupled to the particular word line (WL).

The interconnections for other dual cell memory elements provided within the memory block 300 are similar to the three adjacent dual memory elements 302-1, 302-2 and 302-3 shown in FIG. 3. Hence, although not shown in FIG. 3, it should be recognized that the memory block 300 includes additional dual cell memory elements that are similarly arranged along not only the particular word line (WL) but also other word lines.

Figure 4A:
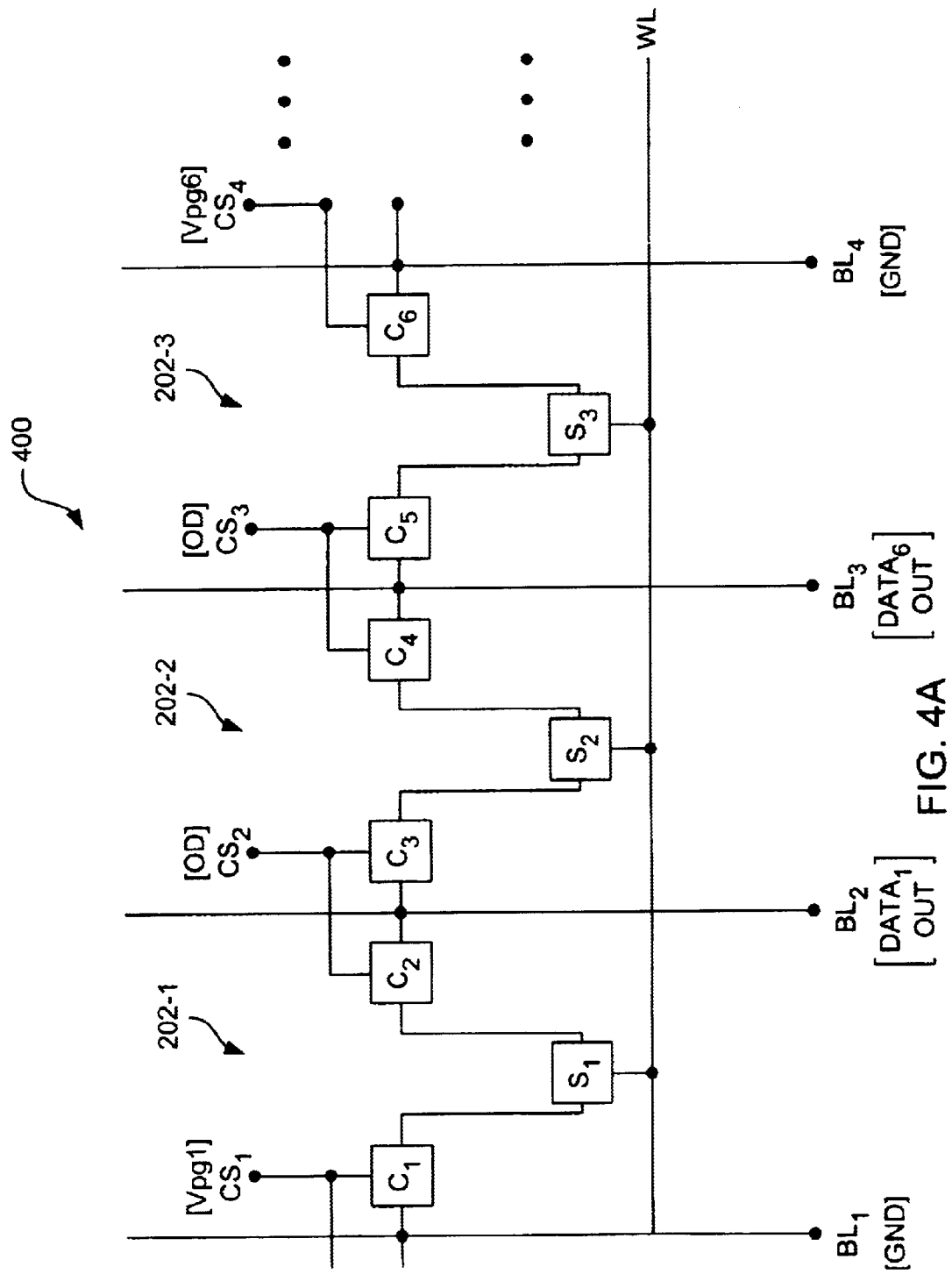
FIG. 4A is a schematic diagram of a memory block that represents the memory block illustrated in FIG. 2 being placed in a read mode.

FIG. 4A is a schematic diagram of a memory block 400 that represents the memory block 200 illustrated in FIG. 2 being placed in a read mode in a virtual ground array architecture. In the particular read mode represented by the memory block 400, the memory cells $C_1$ and $C_5$ are to be simultaneously read. In this regard, the biasing voltages applied to the three adjacent memory elements 202-1, 202-2 and 202-3, such that the memory cells $C_1$ and $C_6$ can be simultaneously read, are as follows. The word line (WL) is activated. The bit lines $BL_1$ and $BL_4$ are grounded, and shared with adjacent memory blocks 400. The control signals $CS_1$ and $CS_4$ are provided with a read voltage Vpg1 and Vpg6, respectively. The control signals $CS_2$ and $CS_3$ are provided with an overdrive voltage (OD). The data is then read out from the memory cells $C_1$ through the bit line $BL_2$, and read out from the memory cell $C_6$ through the bit line $BL_3$. The data being read out from these memory cells $C_1$ and $C_6$ can be referred to as $Data_1$ and $Data_6$, respectively. The data is normally determined by respective sense amplifiers that couple to the bit lines. The sense amplifiers evaluate currents on the bit lines to sense the data values stored in the respective memory cells. Although the voltage levels noted above can vary with application, in one embodiment, representative voltage levels are: Vpg=0–3V depending upon decoding requirements; OD=approx. 4V (should be greater than Vpg); BL=approx. 1V; and WL not greater than BL+$V_{th}$ (threshold voltage).

Figure 4B:
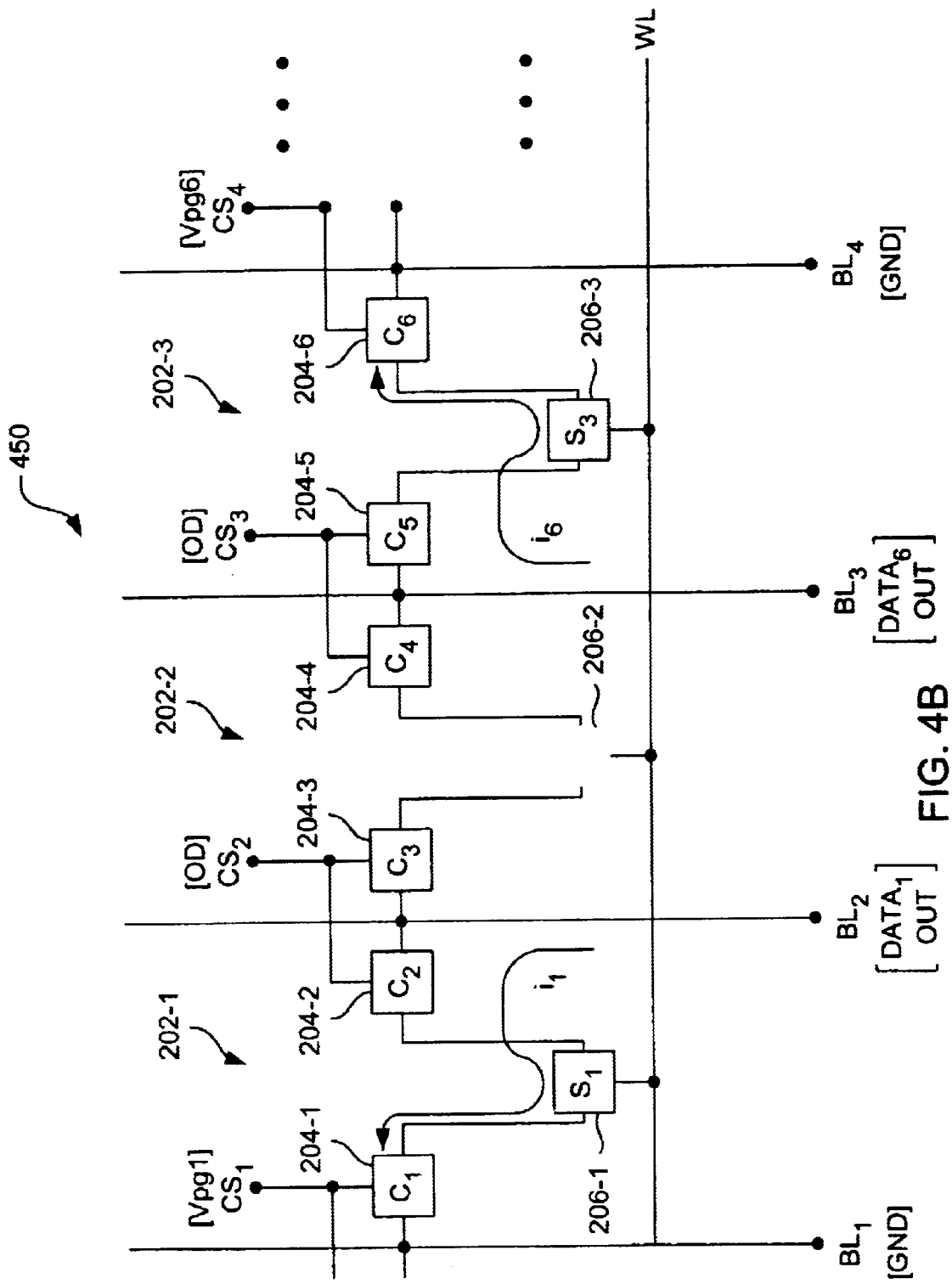
FIG. 4B is a schematic diagram of a memory block during a read mode operation to simultaneously read data from two memory cells.

FIG. 4B is a schematic diagram of a memory block 450 during a read mode operation to simultaneously read data from memory cells $C_1$ and $C_6$. In other words, the memory block 450 shown in FIG. 4B represents the memory block 400 of FIG. 4A during the read mode. Hence, the dual cell memory element 202-1 is configured by the word line (WL), the bit line $BL_1$ and the control signals $CS_1$ and $CS_2$ to read the stored data from the memory cell $C_1$. The data stored to the memory cell $C_1$ is utilized to produce a current $i_1$ that flows through the bit line $BL_2$ to a first sense amplifier (not shown) that discriminates or determines the data stored in the memory cell $C_1$ which is referred to as $Data_1$. Here, the select gate 206-1 is biased to be "on" (conductive), and the memory cell 204-2 is also biased to be "on" (and overdriven) such that a current (dependent on $Data_1$) from the memory cell $C_1$ 204-1 can pass through the select gate $S_1$ 206-1 and the memory cell $C_2$ 204-2 and be coupled to the bit line $BL_2$. The dual cell memory element 202-3 operates in a similar manner to produce a current $i_6$ that flows through the bit line $BL_3$ to a second sense amplifier (not shown) that discriminates or determines the data stored in the memory cell $C_6$ which is referred to as $Data_6$. Here, the select gate 206-3 is biased to be "on" (conductive), and the memory cell 204-5 is also biased to be "on" (and overdriven) such that a current from the memory cell $C_6$ 204-6 can pass through the select gate $S_3$ 206-3 and the memory cell $C_6$ 204-6 and be coupled to the bit line $BL_3$ if the state of the cell $C_6$ 204-6 is conductive as biased The dual cell memory element 202-2, however, operates to effectively isolate the dual cell memory element 202-1 from the dual cell memory element 202-3 during the read mode wherein the memory cells $C_1$ and $C_6$ are being read. Here, the biasing of the select gate $S_2$ 206-2 with respect to $BL_2$ and $BL_3$ is such that the select gate $S_2$ 206-2 is "off" (non-conductive) ($S_2$ has high body bias). As a result, no current flows through the select gate $S_2$ 206-2. Hence, the currents $i_1$ and $i_6$ are not corrupted by charge that might be stored in the dual cell memory element 202-2 or current that might otherwise flow through the dual cell memory element 202-2 between the bit lines $BL_2$ or $BL_3$.

Accordingly, two memory cells of the six memory cells of three adjacent dual cell memory elements can be simultaneously read. Further, with three passes or phases, all six of the memory cells within the three adjacent dual cell memory elements can be read. Indeed, with three passes or phases, all the memory cells associated with a particular word line can be read because two of six adjacent memory cells can be read in each pass or phase.

Figure 5A:
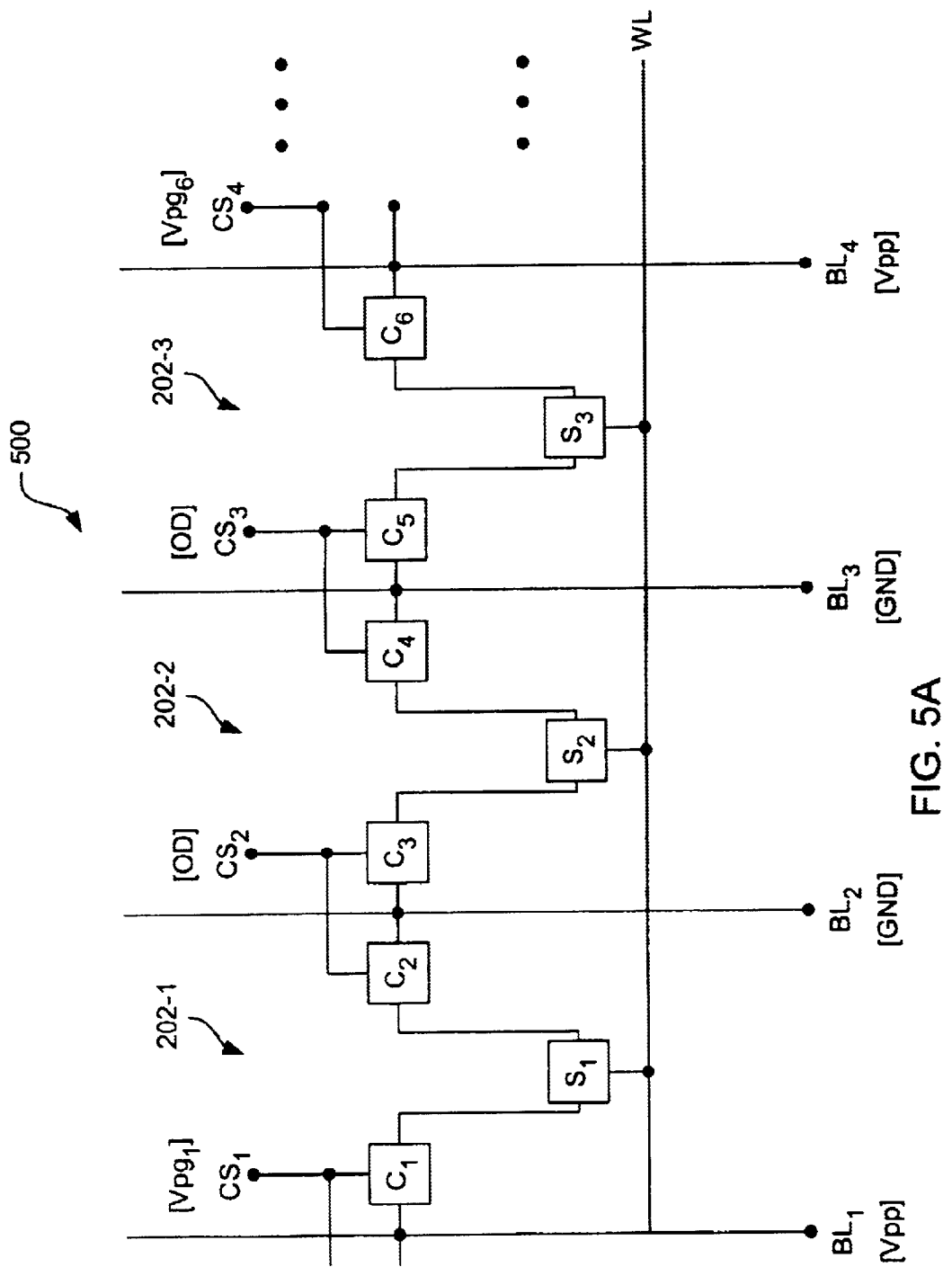
FIG. 5A illustrates a schematic diagram of a memory block that represents the memory block illustrated in FIG. 2 being placed in a program mode.

FIG. 5A illustrates a schematic diagram of a memory block 500 that represents the memory block 200 illustrated in FIG. 2 being placed in a program mode. The program mode can also be referred to as a write mode.

In the particular configuration of the program mode shown in FIG. 5A, the memory cells $C_1$ and $C_6$ are to be programmed simultaneously. In this regard, the biasing voltages applied to the three adjacent memory elements 202-1, 202-2 and 202-3, such that the memory cells $C_1$ and $C_8$ can be simultaneously programmed, are as follows. The word line (WL) is activated. The bit lines $BL_2$ and $BL_3$ are coupled to ground potential or actively pulled-down to a low potential. In addition, a program voltage (Vpp) is placed on the bit lines $BL_1$ and $BL_4$. Further, the control signals $CS_1$ and $CS_4$ are respectively provided with program gate voltages Vpg1 and Vpg6, respectively. The control signals $CS_2$ and $CS_3$ are provided with an overdrive voltage. With the memory cells (C) and the select gates (S) biased in this manner, the memory block 500 is placed in a write mode for the programming of the memory cells $C_1$ and $C_6$.

Hence, two of the six memory cells in the three adjacent dual cell memory elements can be simultaneously programmed. Hence, in three passes or phases, all the memory cells within three adjacent memory elements can be programmed. For example, if a particular word line (WL) supported three-hundred (300) memory cells in the manner in which the memory cells $C_1$ through $C_6$ are represented in FIG. 5A, then in each pass one-hundred (100) of the memory cells could be programmed, and after three passes or phases, all three-hundred (300) of the memory cells could have been programmed. However, in some cases, not all of the memory cells are to be programmed. The programming of the corresponding memory cell can be prevented by placing the relevant bit line (BL) to a high potential. For example, if the bit line $BL_3$ were instead to be placed at a certain high potential instead of at a ground or a low potential, then the memory cell $C_6$ would not be programmed.

Figure 5B:
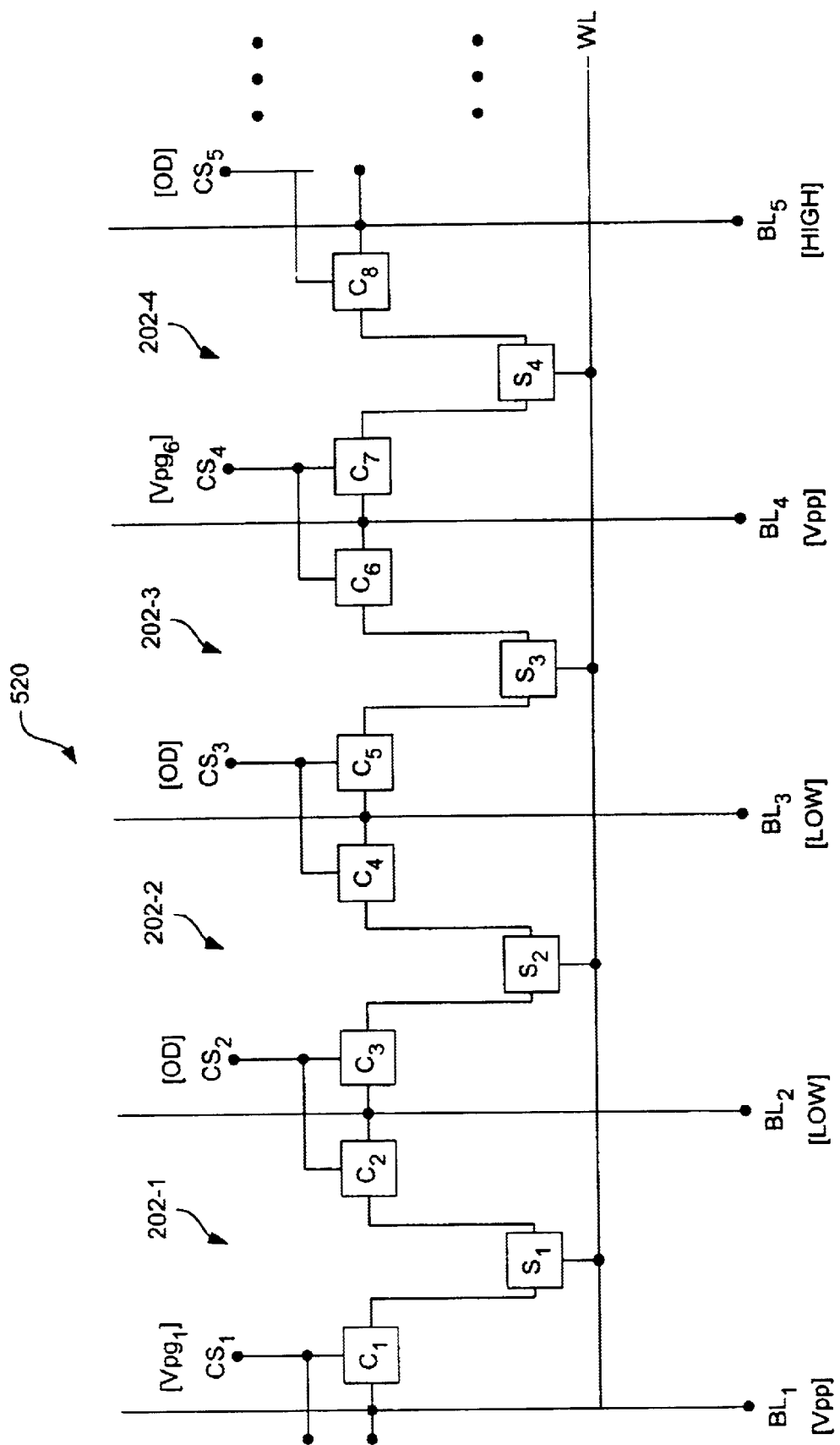
FIG. 5B illustrates a memory block biased to provide a program mode of operation.

To illustrate a program mode for the memory block 500 in additional detail, FIG. 5B illustrates a memory block 520 biased to provide a program mode of operation. In the particular configuration of the memory block 520 shown in FIG. 5B, the memory cells $C_1$ and $C_6$ are to be programmed and memory cell $C_7$ is not to be programmed. Although the unit of programming density pertains to three adjacent dual cell memory elements, the memory block 520 in FIG. 5B shows a fourth dual cell memory element 202-4, which effectively represents a first dual cell memory element within a next grouping of three adjacent memory elements. The biasing of the memory cells (C) is similar to that of FIG. 5A. Namely, the word line (WL) is activated. The bit lines $BL_1$ and $BL_4$ are coupled to a program potential (Vpp). The bit lines $BL_2$ and $BL_3$ are coupled to a low potential because the memory cells $C_1$ and $C_6$ are to be programmed. The bit line $BL_5$ is, however, coupled to a high potential since the memory cell $C_7$ is not to be programmed. Additionally, the control signals $CS_1$ and $CS_4$ are provided with program gate potentials Vpg1 and Vpg6, respectively. The control signals $CS_2$, $CS_3$ and $CS_5$ are provided with an overdrive potential.

Figure 5C:
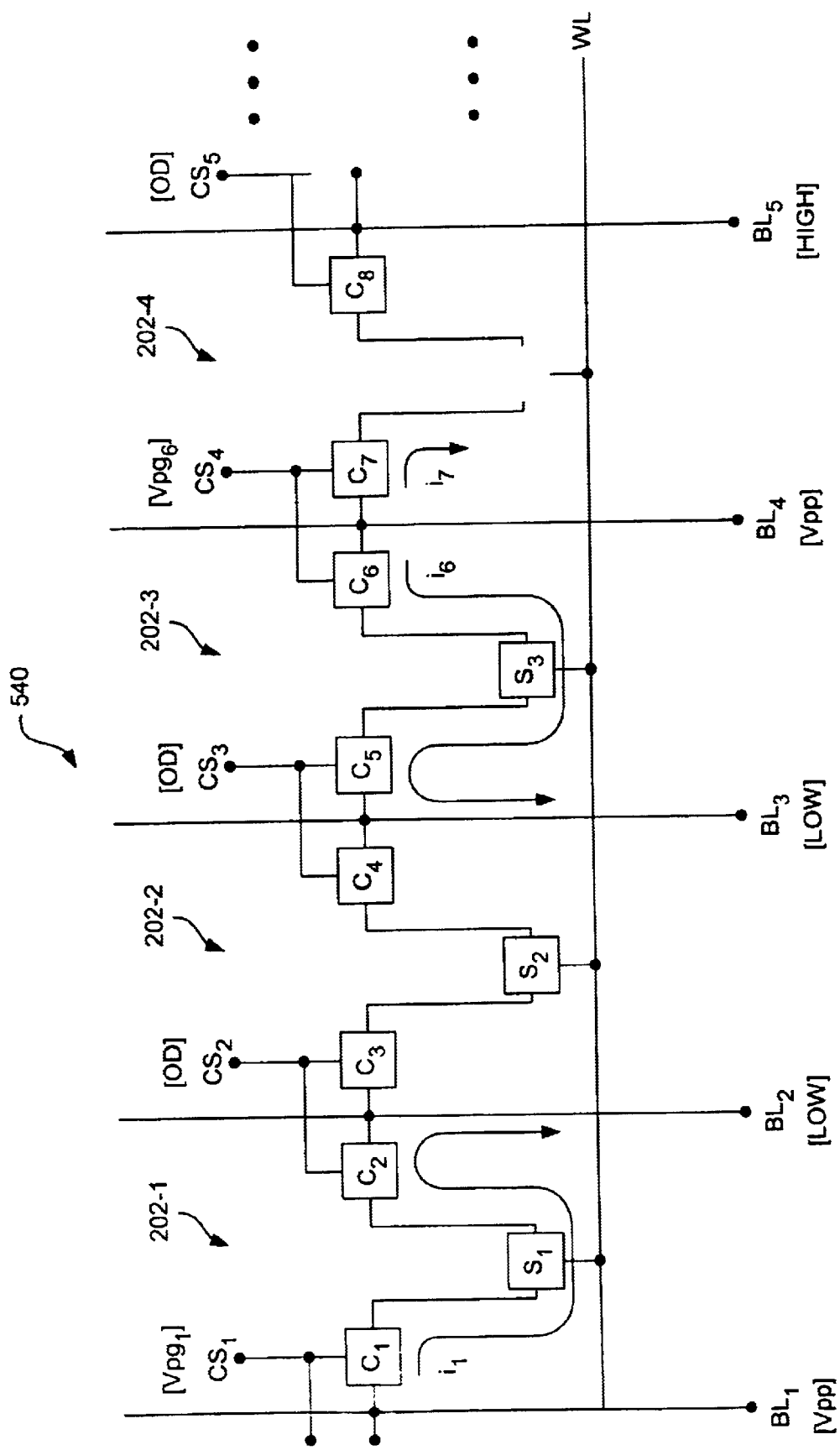
FIG. 5C illustrates a memory block during a program mode operation as provided by the biasing to the memory block shown in FIG. 5B.

FIG. 5C illustrates a memory block 540 during a program mode operation as provided by the biasing to the memory block 520 shown in FIG. 5B. In the particular configuration of the memory block 540, the memory cells $C_1$ and $C_6$ are being simultaneously programmed and the memory cell $C_7$ is not being programmed. As shown in FIG. 5C, the memory cell $C_1$ is able to be programmed to store a data value through use of a current $i_1$. The current $i_1$ flows from the program voltage (Vpp) source coupled to the bit line $BL_1$ through the memory cell $C_1$, thereby programming its floating gate, then through the select gate $S_1$ which is "on" as well as through the memory cell $C_2$ which is also "on" and then to the low potential coupled to the bit line $BL_2$. In a similar manner, the memory cell $C_6$ is programmed through use of a current $i_6$. However, with respect to the memory cell $C_7$, since the bit line $BL_5$ is coupled to a high potential, the biasing for the select gate $S_4$ is such that the select gate $S_4$ is "off" and thus no current effectively flows through the select gate $S_4$. Hence, no programming current $i_7$ flows through the memory cell $C_7$. Consequently, the particular write mode for the memory block 540 shown in FIG. 5C does not operate to program the memory cell $C_7$.

Figure 6:
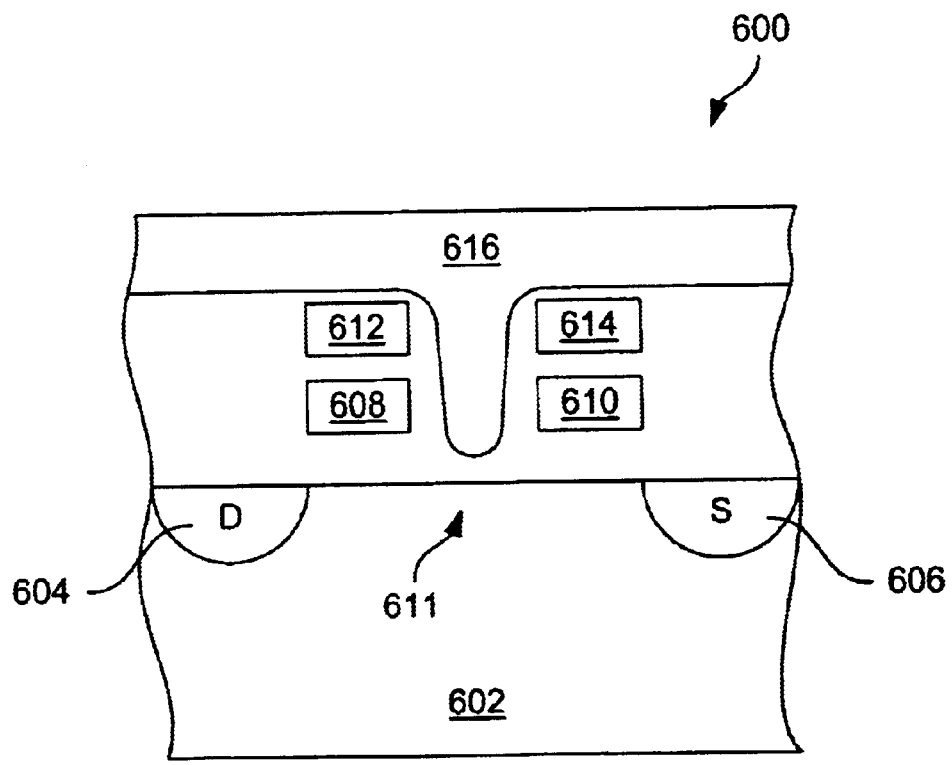
FIG. 6 illustrates a cross-sectional view of a semiconductor structure implementing a representative dual cell storage element.

FIG. 6 illustrates a cross-sectional view of a semiconductor structure implementing a representative dual cell storage element 600. The dual cell storage element 600 is formed on a substrate 602 with a drain 604 and a source 606 diffused into the substrate 602. The dual cell storage element 600 includes floating gates 608 and 610 formed above a channel 611 between the drain 604 and the source 606. In one embodiment, the floating gate 608 and 610 are formed on the substrate with a first layer of polysilicon. The dual cell memory element 600 also includes steering gates 612 and 614 formed over the floating gate 608 and 610, respectively. In one embodiment, the steering gates 612 and 614 are formed on the substrate with a second layer of polysilicon. The steering gates 612 and 614 can also referred to as control gates. Still further, the dual cell storage element 600 includes a select gate 616 that is formed over the select gates 612 and 614 and additionally extends downward towards the channel 611 between not only the steering gates 612 and 614 but also the floating gates 608 and 610.

The invention can further pertain to an electronic system that includes a memory system as discussed above. Memory systems (i.e., memory cards) are commonly used to store digital data for use with various electronic products. Often, the memory system is removable from the electronic system so that the stored digital data is portable. The memory systems according to the invention can have a relatively small form factor and be used to store digital data for electronic products such as cameras, hand-held or notebook computers, network cards, network appliances, set-top boxes, hand-held or other small audio players/recorders (e.g., MP3 devices), and medical monitors.

The advantages of the invention are numerous. Different embodiments or implementations may yield one or more of the following advantages. One advantage of the invention is that reading and/or programming can be performed with respect to a memory array with increased performance (i.e., increased parallelism). Another advantage of the invention is that inter bit line isolation during reading and/or programming is improved. Still another advantage of the invention is that during reading and/or programming current between adjacent bit lines can be essentially zero because parasitic currents are controlled, thereby allowing high accuracy operation.

The many features and advantages of the present invention are apparent from the written description and, thus, it is intended by the appended claims to cover all such features and advantages of the invention. Further, since numerous modifications and changes will readily occur to those skilled in the art, the invention should not be deemed limited to the exact construction and operation as illustrated and described. Hence, all suitable modifications and equivalents are included within the scope of the invention.

What is claimed is:

1. A non-volatile semiconductor memory device, comprising:

a plurality of bit lines;

a plurality of word lines; and a plurality of dual cell storage elements, each of said dual cell storage elements including at least a source device, a drain device and a select device, wherein two out of a total of six of said source devices and said drain devices in three adjacent dual cell memory units along a particular one of said word lines are able to be programmed or read simultaneously.

2. A non-volatile semiconductor memory device as recited in claim 1, wherein each of said select devices couples to one of said word lines, and wherein each of said source devices and said drain devices couple between one of said bit lines and one of said select devices.

3. A non-volatile semiconductor memory device as recited in claim 1, wherein each of said source device and said drain devices include a floating gate.

4. A non-volatile semiconductor memory device as recited in claim 3, wherein said select devices do not include a floating gate.

5. A non-volatile semiconductor memory device as recited in claim 1, wherein said storage elements are Flash type storage elements.

6. A non-volatile semiconductor memory device as recited in claim 1, wherein said storage elements are EEPROM type storage elements.

7. A non-volatile semiconductor memory device as recited in claim 1, wherein said non-volatile semiconductor memory device is provided within a memory card.

8. A portable memory card, comprising:

a data storage array, said data storage array including at least a plurality of bit lines, a plurality of word lines, and a plurality of dual cell storage elements, each of said dual cell storage elements including at least a source device, a drain device and a select device; and a controller operatively connected to said storage elements, said controller operating to control reading and writing to said data storage array, wherein two of said source devices and said drain devices in three adjacent dual cell storage elements along a particular one of said word lines are able to be programmed or read simultaneously.

9. A portable memory card as recited in claim 8, wherein each of said select devices couple to one of said word lines, wherein each of said source devices and said drain devices couple between one of said bit lines and one of said select devices, and wherein the three adjacent dual cell storage elements together include three of said source devices and three of said drain devices.

10. A portable memory card as recited in claim 8, wherein said data storage array is provided on a single semiconductor chip.

11. A portable memory card as recited in claim 8, wherein said portable memory card is a memory system on a chip.

12. A method for reading data from a non-volatile memory, said method comprising:

identifying three adjacent memory elements along a particular word line, each of the three adjacent memory elements being coupled between an adjacent pair of bit lines, each of the three adjacent memory elements including at least a pair of memory cells;

coupling one of the bit lines in each of the adjacent pairs of the bit lines surrounding each of two of the three adjacent memory elements having a memory cell to be read to a low potential;

coupling a read voltage to the memory cell to be read in each of two of the three adjacent memory elements having a memory cell to be read;

coupling an overdrive voltage to the other memory cells in the three adjacent memory cells; and thereafter simultaneously reading data from one of the two memory cells in the two of the three adjacent memory elements having a memory cell to be read via another of the bit lines in each of the adjacent pairs of the bit lines surrounding each of two of the three adjacent memory elements having a memory cell to be read.

13. A method as recited in claim 12, wherein said reading comprises:

coupling the another of the bit lines in each of the adjacent pairs of the bit lines surrounding each of two of the three adjacent memory elements having a memory cell to be read to sense amplifiers, respectively; and simultaneously reading data from one of the two memory cells in the two of the three adjacent memory elements having a memory cell to be read using the sense amplifiers.

14. A method as recited in claim 12, wherein each of the three adjacent memory elements further including at least a select element.

15. A method as recited in claim 14, wherein said method further comprises:

operating the select element in the one of the three adjacent memory elements not having a memory cell to be read to isolate the two of the three adjacent memory elements having a memory cell to be read from one another.

16. A method as recited in claim 15, wherein said operating provides a positive voltage on those of the bit lines that are not coupled to the low potential.

17. A method as recited in claim 15, wherein said operating comprises coupling another of the bit lines in each of the adjacent pairs of the bit lines surrounding each of two of the three adjacent memory elements having a memory cell to be read to a potential that enables the select element to become non-conductive.

18. A method as recited in claim 15, wherein said operating of the select element is controlled based in part on the particular word line.

19. A method as recited in claim 15, wherein the low potential is ground.

20. A method for reading data from a non-volatile memory, said method comprising:

providing a non-volatile memory having an array of memory elements, a plurality of bit lines, a plurality of word lines, and a plurality of gate control signals;

identifying first, second and third memory elements that are adjacent one another along a particular word line, each of the first, second and third memory elements including at least a pair of memory cells and a select gate;

identifying first, second, third and fourth bit lines that are adjacent one another along the particular word line, the first memory element being interposed between the first bit line and the second bit line, the second memory element being interposed between the second bit line and the third bit line, and the third memory element being interposed between the third bit line and the fourth bit line;

identifying a first memory cell in the first memory element and a second memory element in the third memory element to be read;

coupling the first bit line and the fourth bit line to a low potential;

coupling the other memory cells in the first, second and third memory elements other than the first and second memory cells to a high potential;

coupling the particular word line to the select gates for the each of the first, second and third memory elements;

coupling a read voltage to the first and second memory cells to be read; and thereafter simultaneously reading data from one of the first and second memory cells via the second and third bit lines.

21. A method as recited in claim 20, wherein the memory cells are floating gate memory cells.

22. A method as recited in claim 20, wherein the low potential is ground potential.

23. A method as recited in claim 20, wherein the high potential is an overdrive voltage.

24. A method for programming data to a non-volatile memory, said method comprising:

identifying three adjacent memory elements along a particular word line, each of the three adjacent memory elements being coupled between an adjacent pair of bit lines, each of the three adjacent memory elements including at least a pair of memory cells;

coupling one of the bit lines in each of the adjacent pairs of the bit lines surrounding each of two of the three adjacent memory elements having a memory cell to be programmed to a program level potential;

coupling the other of the bit lines in each of the adjacent pairs of the bit lines surrounding each of two of the three adjacent memory elements having a memory cell to be programmed to a low potential;

coupling a program gate voltage to the memory cell to be programmed in each of two of the three adjacent memory elements having a memory cell to be read;

coupling an overdrive voltage to the other memory cells in the three adjacent memory cells; and thereafter simultaneously programming data to one of the two memory cells in the two of the three adjacent memory elements having a memory cell to be programmed.

25. A method as recited in claim 24, wherein the low potential is a ground potential.

26. A method as recited in claim 24, wherein each of the three adjacent memory elements further including at least a select element.

27. A method as recited in claim 26, wherein said method further comprises:

operating the select element in a fourth adjacent memory element not having a memory cell to be programmed to isolate the fourth adjacent memory element from being programmed.

28. A method as recited in claim 27, wherein said operating of the select element is controlled based in part on the particular word line.

29. A method as recited in claim 27, wherein the low potential is ground.

30. A method for programming data to a non-volatile memory, said method comprising:

providing a non-volatile memory having an array of memory elements, a plurality of bit lines, a plurality of word lines, and a plurality of gate control signals;

identifying first, second and third memory elements that are adjacent one another along a particular word line, each of the first, second and third memory elements including at least a pair of memory cells and a select gate;

identifying first, second, third and fourth bit lines that are adjacent one another along the particular word line, the first memory element being interposed between the first bit line and the second bit line, the second memory element being interposed between the second bit line and the third bit line, and the third memory element being interposed between the third bit line and the fourth bit line;

identifying a first memory cell in the first memory element and a second memory element in the third memory element to be programmed;

coupling the first bit line and the fourth bit line to a program level potential;

coupling the other memory cells in the first, second and third memory elements other than the first and second memory cells to a high potential;

coupling the particular word line to the select gates for the each of the first, second and third memory elements;

coupling a program voltage to the first and second memory cells to be programmed; and thereafter simultaneously programming data to the first and second memory cells.

31. A method as recited in claim 30, wherein the memory cells are floating gate memory cells.

32. A method as recited in claim 30, wherein the low potential is ground potential.

33. A method as recited in claim 30, wherein the high potential is an overdrive voltage.

* * * * *

UNITED STATES PATENT AND TRADEMARK OFFICE
CERTIFICATE OF CORRECTION

PATENT NO. : 6,795,349 B2
DATED : September 21, 2004
INVENTOR(S) : Raul A. Cernea It is certified that error appears in the above-identified patent and that said Letters Patent is hereby corrected as shown below:

<u>Title page,</u>
Item [56], References Cited, U.S. PATENT DOCUMENTS, add:
-- 6,493,269 B1   12/2002   Cernea......................365/185.28 --

Signed and Sealed this

Seventh Day of June, 2005

JON W. DUDAS
*Director of the United States Patent and Trademark Office*